(12) United States Patent
Tanaka et al.

(10) Patent No.: US 6,629,342 B1
(45) Date of Patent: Oct. 7, 2003

(54) METHOD FOR PRODUCING AN AT-CUT RESONATOR

(75) Inventors: Yoshiaki Tanaka, Kouza-gun (JP); Mitsuhiro Nishida, Kouza-gun (JP); Toshio Sugiyama, Kouza-gun (JP); Hiroyuki Kobayashi, Kouza-gun (JP)

(73) Assignee: Toyo Communication Equipment Co., Ltd., Kanagawa (JP)

(*) Notice: Subject to any disclaimer, the term of this patent is extended or adjusted under 35 U.S.C. 154(b) by 330 days.

(21) Appl. No.: 09/614,083

(22) Filed: Jul. 11, 2000

Related U.S. Application Data

(62) Division of application No. 09/202,737, filed as application No. PCT/JP98/01526 on Apr. 2, 1998, now Pat. No. 6,114,801.

(30) Foreign Application Priority Data

Apr. 14, 1997 (JP) .............................. 9-111840
Oct. 29, 1997 (JP) .............................. 9-312846

(51) Int. Cl.⁷ ............................................. H04R 17/00
(52) U.S. Cl. ....................... 29/25.35; 310/361; 310/365
(58) Field of Search ......................... 29/25.35; 310/360, 310/361, 365, 311, 368, 369

(56) References Cited

U.S. PATENT DOCUMENTS

| | | | | |
|---|---|---|---|---|
| 4,232,109 A | * | 11/1980 | Kizaki | 216/47 |
| 4,306,170 A | * | 12/1981 | Motte et al. | 310/361 |
| 5,228,344 A | * | 7/1993 | Hojoh | 73/702 |
| 5,577,308 A | * | 11/1996 | Arvanitis et al. | 204/192.18 |
| 6,014,799 A | * | 1/2000 | Kaida | 29/25.35 |
| 6,172,443 B1 | * | 1/2001 | Branham | 310/313 A |

FOREIGN PATENT DOCUMENTS

GB 1028134 * 5/1966 ............ H03H/9/19

* cited by examiner

Primary Examiner—Carl J. Arbes
Assistant Examiner—Thiem Dinh Phan
(74) Attorney, Agent, or Firm—Koda & Androlia

(57) ABSTRACT

In an AT-cut quartz resonator having excitation electrodes formed on two principal surfaces of an AT-cut quartz substrate, the two electrodes are displaced a predetermined amount apart in a direction orthogonal to the X-axis direction so that a frequency deviation in a temperature range of from −10° C. to 50° C. is less than ±2.5 ppm. Further, in an AT-cut quartz resonator in which vertically opposed electrodes on both principal surfaces of a quartz substrate are slightly displaced apart in opposite directions along the Z' axis of quartz crystal, a balancing load is formed on a piezoelectric substrate on the side opposite to the direction of displacement of the electrodes. Thus, the present invention dispenses with the need for raising the ratio of conforming to nonconforming quartz substrates by eliminating variations in their cutting angle, but makes it possible to use nonconforming quartz substrates to offer customers low-cost quartz resonators of oscillation frequencies following various specs, by making easy, simple structural modifications of slightly changing the electrode arrangement or structure, or by making simple improvements to the conventional quartz resonator manufacturing process. In the manufacture of oscillators for use in consumer-electronics equipment, it is possible to fulfill any particulars specs without inserting a temperature compensating circuit in the oscillation circuit. In regards to industrial equipment, any adjustments need not be made to the temperature compensating circuit in the oscillation circuit, and this improves the productivity of various communications equipment and various electronics equipment and reduces their manufacturing costs.

16 Claims, 10 Drawing Sheets

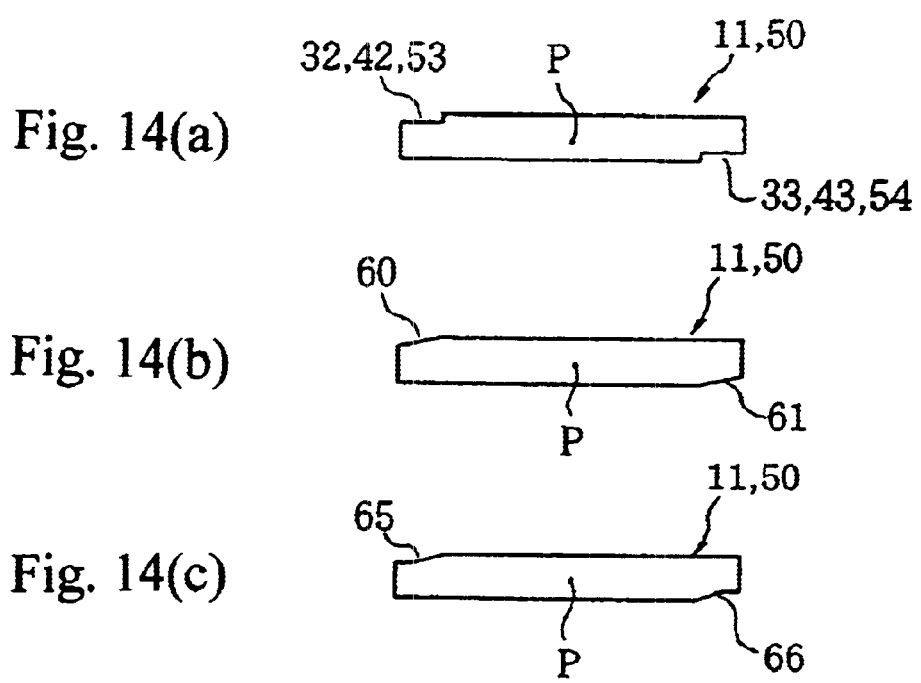

METHOD FOR PRODUCING AN AT-CUT RESONATOR

This is a Divisional Application of application Ser. No. 09/202,737, filed Dec. 14, 1998, now U.S. Pat. No. 6,114,801, which is the U.S. national stage of PCT/JP98/01526, filed Apr. 2, 1998.

BACKGROUND OF THE INVENTION

1. Field of the Invention

The present invention relates to an AT-cut quartz resonator which is adapted so that a deviation of its resonance frequency from a target value, which is attributable to an error of the angle of cutting out a quartz substrate from an artificially grown quartz crystal, can be corrected through a simple modification of the electrode structure and hence kept within acceptable limits, thereby eliminating the addition of a temperature compensating circuit to the incorporation of the quartz resonator into an oscillation circuit in consumer-oriented electronic products and negating the need for adjustment of the temperature compensating circuit in industrial equipment.

2. Description of the Prior Art

Heretofore, quartz oscillators have been widely used as reference frequency generators for communications equipment, industrial equipment, consumer-electronics products, and so forth because of their excellent characteristics such as small size, high frequency accuracy and high frequency stability. Quartz resonators are also used in a wide variety of communications equipment in large quantities; for example, a plurality of quartz resonators are used to form a crystal filter, or a quartz resonator, an amplifier circuit and a temperature compensating circuit are used, in combination, to form a temperature compensated crystal oscillator (TCXO). The oscillation frequency of the crystal oscillator depends on the resonance frequency of the quartz resonator forming the oscillator. The quartz is a physically stable piezoelectric crystal, whose resonance frequency also has extremely high stability. In particular, an AT-cut quartz resonator has excellent temperature-frequency characteristics, and for this reason, it is frequently used in various fields.

The AT-cut quartz resonator has, as is well-known in the art, a pair of opposed electrode patterns for excitation deposited on both sides of a quartz substrate. The quartz substrate of an AT-cut quartz resonator is a Y plate having an angle θ about the X axis of 35 degrees 15 minutes obtained by cutting out it of artificially grown quartz crystal. The resonance frequency of the AT-cut quartz resonator depends on the thickness of the quartz substrate.

This quartz resonator is placed and sealed in a package provided with a required support structure to form one piezoelectric device. Further, a quartz oscillator is formed by inserting the quartz resonator in an oscillation circuit loop constructed using chip parts or the like on a printed board. While the AT-cut quartz resonator is small in the amount of the change in the resonance frequency with a change in temperature as compared with quartz resonators of other cutting angles as referred to above, it is known in the art that the AT-cut quartz resonator shows a cubic-like temperature-frequency characteristic with a point of inflection at about 27° C., for example, as depicted in FIG. 5.

But the temperature-frequency characteristic varies with the angle θ for cutting out the quartz substrate from quartz crystal. That is, the temperature-frequency characteristic of the AT-cut quartz resonator becomes a function of the cutting angle θ, forming the cubic curve having an inflection point at 27° C.

FIG. 6 is a graph showing temperature-frequency characteristics of ordinary quartz resonators using three kinds of quartz substrates of slightly different cutting angles. For example, in Japan specifications about a reference frequency source of a pager (beeper) as consumer-oriented communication equipment require that a frequency deviation in a temperature range of −10° C. to 50° C. be held ±2 ppm. Assume, for instance, that the curve A in FIG. 6 is representative of the frequency deviation which meets the above mentioned specs. In this instance, the specs ought to be met by a quartz resonator using a quartz substrate cut out at an angle that provides the temperature characteristic corresponding to the curve A.

However, even if an attempt is made to cut out from quartz crystal a quartz substrate which meets such specs, a wide range of variations in the cutting angle of the AT-cut quartz substrate results from limitations on the machining accuracy of a cutter for cutting the quartz substrate out. With a greatly varied cutting angle, a frequency deviation of around ±5 ppm occurs in the temperature range of −10° C. to 50° C. On this account, percentages of good products that meet the specs of consumer-oriented equipment are as low as 20% to 30%, constituting a major factor in raising the cost of production of quartz resonators.

To meet the specs, it is general practice in the prior art that quartz resonators of frequency deviations exceeding ±2 ppm in the temperature range of −10° C. to 50° C. are each incorporated into a temperature compensated oscillation circuit added with a temperature compensating circuit. However, the temperature characteristic of every AT-cut quartz resonator shows a different temperature characteristic curve; therefore, the use of such a temperature compensating circuit for each quartz resonator involves an additional step of adjusting values of individual elements of the compensating circuit in the manufacture of consumer-oriented equipment, inevitably resulting in an increase in the cost of production.

Specifications about the quartz resonator for use in industrial communication equipment such as a cellular telephone also require that the frequency deviation in a range of −30° C. to 75° C. be held within ±2 ppm. It is impossible, however, to realize an AT-cut quartz resonator that meets such specs, now matter what cutting angle is chosen and no matter how much the cutting accuracy is improved.

For the reasons given above, a temperature compensating circuit is essential to an oscillator for use in industrial equipment. As in the case with consumer-oriented equipment, variations in the cut angle of the quartz substrate leads to dispersion in the temperature characteristics of quartz resonators, and values of individual elements of each compensating circuit need to be adjusted. Since this adjustment operation is extremely cumbersome, the addition of such a manufacturing process raises the cost of production of industrial equipment.

Such disadvantages as mentioned above ought to be completely overcome simply by raising a yield rate of quartz resonators. That is, if quartz resonators which fulfill various specs can be offered with high productivity and with a high yield rate, it will be possible to fabricate an oscillator for consumer-electronics products which follows the specs without inserting the temperature compensating circuit in the oscillation circuit; in industrial equipment, it will also be possible to eliminate the need for adjusting the temperature compensating circuit in the oscillation circuit. This ought to improve the productivity of various communication and electronic gears and cut their manufacturing costs.

With a view to obtaining an oscillator for consumer-oriented products with no temperature compensating circuit and obviating the need for making adjustments to the temperature compensating circuit in industrial equipment, the object of present invention is to provide AT-cut quartz resonators which do not exhibit a wide range of temperature characteristic variation, that is, AT-cut quartz resonators whose temperature characteristics fall within a range of ±2 ppm, for example, in the temperature range of −10° C. to 50° C.

DISCLOSURE OF THE INVENTION

To attain the above objective, the invention of claim 1 is an AT-cut quartz resonator which has excitation electrodes formed on two principal surfaces of an AT-cut quartz substrate and which is characterized in that the above-described two electrodes are displaced a predetermined amount apart in a direction orthogonal to the X-axis direction so that a frequency deviation in a temperature range of from −10° C. to 50° C. is less than ±2.5 ppm.

The invention of claim 2 is an AT-cut quartz resonator which is characterized in that when the relative distance between the above-described two electrodes in the direction to the X-axis direction is represented by d, then 50 $\mu m \geq d \geq$ or 0.5 mm.

The invention of claim 3 is an AT-cut quarts resonator which is characterized in that at least one of the sides of at least one of the above-described two electrodes along the X axis is trimmed off substantially the entire length thereof.

The invention of claim 4 is an AT-cut quartz resonator which has excitation electrodes formed on two principal surfaces of an AT-cut quartz substrate and which is characterized in that when the cutting angle of the above-described quartz substrate differs from a target value, the above-described two electrodes are displaced a predetermined amount apart in a direction orthogonal to the X-axis direction so that a frequency deviation of the-above-described quartz resonator in a predetermined temperature range is smaller than a desired value.

The invention of claim 5 is an AT-cut quartz resonator which is characterized in that at least one of the sides of at least one of the above-described two electrodes along the X axis is trimmed off substantially the entire length thereof.

The invention of claim 6 is an AT-cut quartz resonator in which vertically opposed electrodes on both principal surfaces of a quartz substrate are slightly displaced apart in opposite directions along the Z' axis of a quartz crystal and which is characterized in that a balancing load is formed on a piezoelectric substrate on the side opposite to the direction of displacement of the above-described electrodes, thereby slightly tilting an electric field between the above-described electrodes at their end portions and changing the apparent cutting angle due to the mass effect of the above-described balancing loads to correct the frequency-temperature characteristic of the above-described resonator.

The invention of claim 7 is an AT-cut quartz resonator which is characterized in that the above-described balancing load is formed along each of the above-described electrodes in an adjacent relation thereto.

The invention of claim 8 is an AT-cut quartz resonator which is characterized in that its frequency-temperature characteristic is slightly corrected by trimming off the above-described balancing load by a laser or electron beam.

The invention of claim 9 is an AT-cut quartz resonator which has excitation electrodes formed on two principal surfaces of an AT-cut quartz substrate and which is characterized in that adjustment regions are formed by removing surface regions of the above-described AT-cut quartz substrate, as required, along its marginal edges extending in parallel to the X axis.

The invention of claim 10 is the AT-cut quartz resonator of claim 9 which is characterized in that the above-described adjustment regions are formed along two point-symmetrical marginal edges of the above-described AT-cut quartz substrate extending in parallel to the X axis.

The invention of claim 11 is the AT-cut quartz resonator of claim 9 or 10 which is characterized in that the above-described adjustment regions are each formed along the entire length of the above-described marginal edge or along some part of the length thereof.

The invention of claim 12 is the AT-cut quartz resonator of claim 9, 10, or 11 which is characterized in that the above-described AT-cut quartz substrate is rectangular or circular in plan configuration.

The invention of claim 13 is the AT-cut quartz resonator of claim 9, 10, 11, or 12 which is characterized in that the above-described adjustment regions are also formed along marginal edges of the AT-cut quartz substrate extending along the Z axis other than those extending in parallel to the X axis sectional configuration of each of the above-described adjustment regions is stepped or bevelled, or a combination thereof.

The invention of claim 14 is the AT-cut quartz resonator of claim 9, 10, 11, 12, or 13 which is characterized in that the sectional configuration of each of the above-described adjustment regions is stepped or bevelled, or a combination thereof.

BRIEF DESCRIPTION OF THE DRAWINGS

FIGS. 14(a), (b) and (c) are diagrams for explaining sectional configurations of adjustment regions according to the third embodiment of the present invention.

BEST MODE FOR CARRYING OUT THE INVENTION

The present invention will hereinafter be described in detail with reference to its embodiments depicted in the accompanying drawings.

First Embodiment

Construction of the First Embodiment

With an eye toward improving the yield rates of AT-cut quartz resonators whose temperature-frequency characteristics deviate within given limits, for example, ±2 ppm at maximum in the temperature range of −10° C. to 50° C. even if cutting angles of their quartz substrates differ from a target value in excess of a predetermined angle, for example, 2 to 3 degrees, the structural feature of the present invention resides in that excitation electrodes on both sides of the quartz substrate are shifted relative to each other from the position of perfect alignment in a direction orthogonal to the X-axis direction so as to correct a frequency drift resulting from the error in the cutting angle.

Figure 1A:
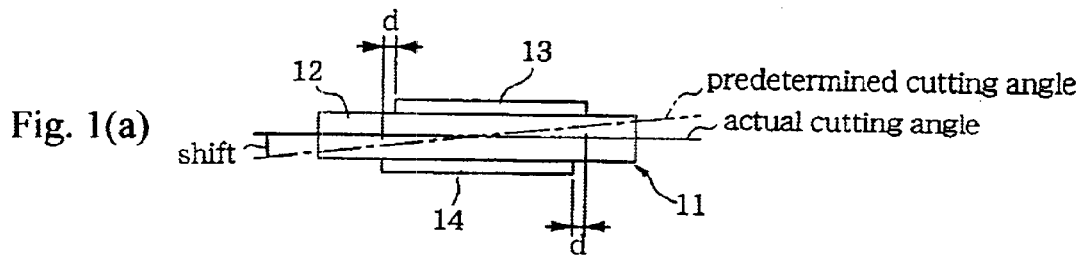
FIG. 1(*a*) is a sectional view of a quartz resonator provided with an electrode structure according to the present invention, and FIG. 1(*b*) is its perspective top view.
Figure 1B:
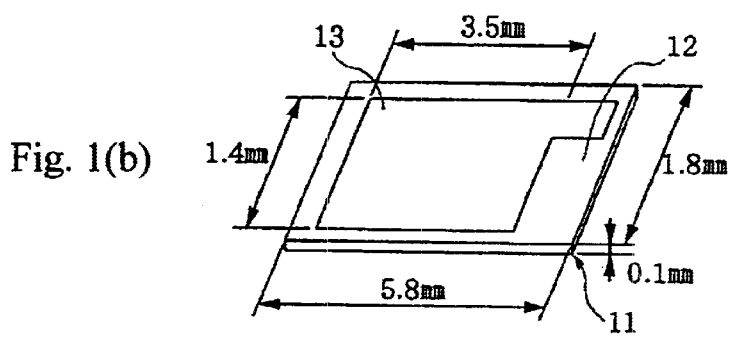

FIG. 1(a) is a sectional view for explaining the electrode structure of the quartz resonator according to the present invention, and FIG. 1(b) is its perspective view. The quartz resonator, identified generally by 11, has a pair of opposed electrodes 13 and 14 formed by photolithography on both sides of a quartz substrate cut out at an angle different from a target value (a cutting angle that keeps the frequency deviation, for example, at −10° C. to 50° C. within the range of ±2 ppm); however, unlike those in the prior art, the two electrodes 13 and 14 are not exactly identical in shape nor are they in perfect alignment but they are displaced a distance d apart in a direction orthogonal to the X-axis direction.

On the AT-cut quartz resonator of such dimensions as depicted in FIG. 1(b), it was ascertained that the temperature characteristic curve changed about 5 to 6 ppm in terms of frequency deviation at −10° C. (equivalent to a change caused by an error of 2 to 3' in the cutting angle) when the electrodes 13 and 14 to be formed on both sides of the quartz substrates were not in perfect alignment with each other but were displaced 0.3 mm or so apart in the direction orthogonal to the X-axis direction. It was also found that when the amount of displacement d of the electrodes was 0.5 mm, the temperature characteristic curve similarly changed around 7 to 8 ppm in terms of frequency deviation at −10° C. (equivalent to a change by an error of 5 to 6' in the cutting angle).

As described above, according to this embodiment, the frequency deviation of the quartz resonator, which results from a variation in the cutting angle for cutting out the quartz substrate, can be kept within a target zone by a simple operation of displacing the electrodes apart; that is, the desired frequency deviation can be obtained. As the result of this, substantially 100% yield rates of quartz resonators can be achieved.

By shifting the positions of the two electrodes relative to each other as mentioned above, it is possible to obtain a quartz resonator of the maximum frequency deviation which fulfills the specs about consumer-oriented products despite using a nonconforming quartz substrate 12 cut out at an angle different from a predetermined value. This eliminates the need for adding a temperature compensating circuit to the oscillation circuit in the package when incorporating therein the quartz resonator; hence, it is possible to reduce the number of man-hours and cut the cost of production.

Figure 2A:
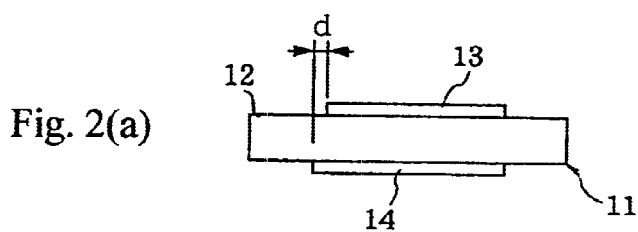
FIGS. 2(*a*) and (*b*) are sectional views showing electrode structures of quartz resonators according to other embodiments of the present invention.
Figure 2B:
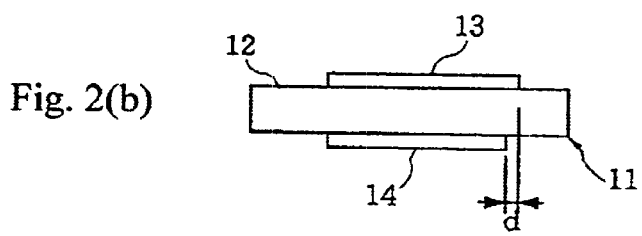

FIGS. 2(a) and (b) depict other examples of displacement of the two electrodes. FIG. 2(a) illustrates an electrode structure in which the electrode 13 has its one marginal portion in the X-axis direction displaced the predetermined distance d further in the direction normal to the X-axis direction than the corresponding marginal edge of the electrode 14 (so that the former electrode is shorter than the latter in the X-axis direction), thereby correcting the frequency deviation attributable to an error in the cutting angle of the quartz substrate. FIG. 2(b) illustrates an electrode structure in. which only one of two opposite marginal portions of the electrode 14 in the X-axis direction is displaced the predetermined distance further inward in the direction orthogonal to the X-axis direction than the other marginal portion of the electrode 13, thereby correcting the frequency deviation resulting from an error in the cut angle of the quartz substrate.

It was experimentally demonstrated that either electrode structure is effective in correcting the frequency deviation of the quartz resonator which is attributable to an error in the cutting angle of the quartz substrate.

While in the above the present invention has been described as being applied to rectangular quartz substrates, the invention is not limited thereto but is also applicable to quartz resonators of the type that have circular electrodes on circular substrates.

Method of Making the Quartz Resonator of the First Embodiment

Photolithography

FIGS. 3(a) to (f) depicts a sequence of process steps involved in the formation of the electrodes of the quartz resonator according to the present invention. The electrode formation begins with a metallic film evaporating step (a) of evaporating an aluminum film 20 onto the quartz substrate 12 over the entire areas of its both sides. This is followed by measuring the temperature-frequency characteristic of the quartz substrate.

The next step is a photoresist coating step (b) of coating a photoresist 21 all over the aluminum film 20 on either side of the substrate.

Then, in the next exposure step (c) the photoresist layer 21 on either side of the substrate is exposed to light through a mask 22 having an aperture 22a corresponding to a desired shape of the electrode, followed by a development step (d) of removing unexposed portions of the photoresist layer. In the present invention, the positions of the apertures 22a (identical in shape) of the masks 22 in the step (c) are shifted a predetermined distance in the direction orthogonal to the X-axis direction so that the electrodes 13 and 14 are displaced apart as depicted in FIG. 1 or FIGS. 2(a) and (b).

Figure 3A:
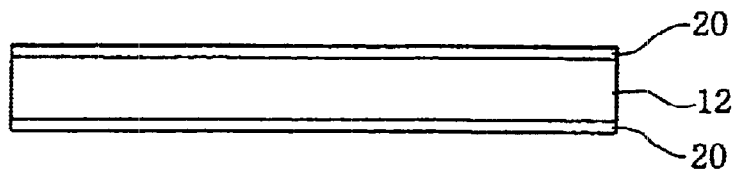
FIGS. 3(*a*) to (*f*) are diagrams showing a sequence of steps involved in the manufacture of the quartz resonator according to the present invention.
Figure 3B:
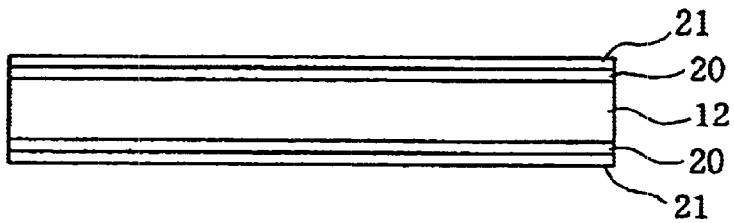
Figure 3C:
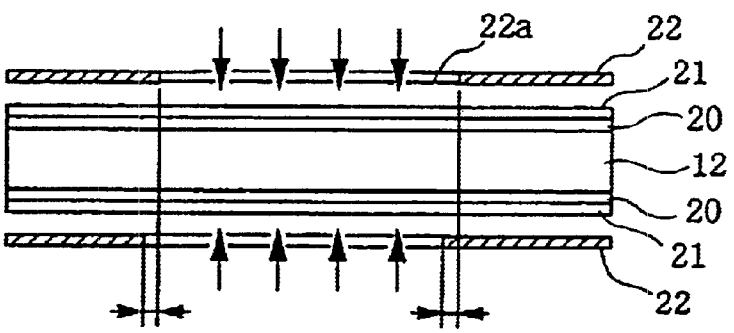
Figure 3D:
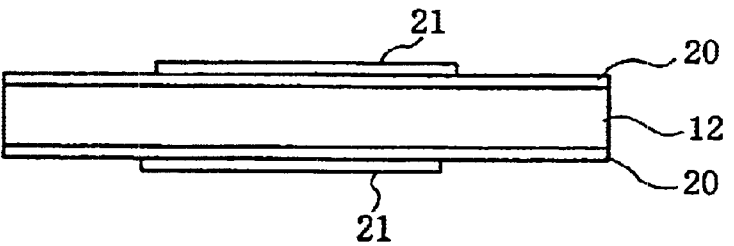
Figure 3E:
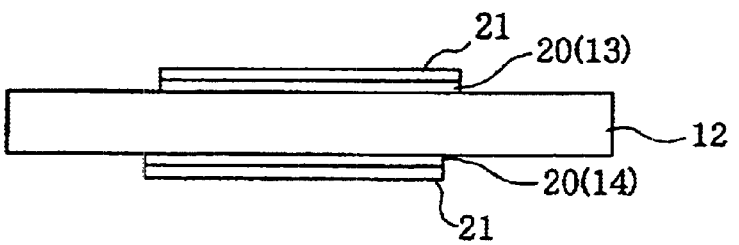
Figure 3F:
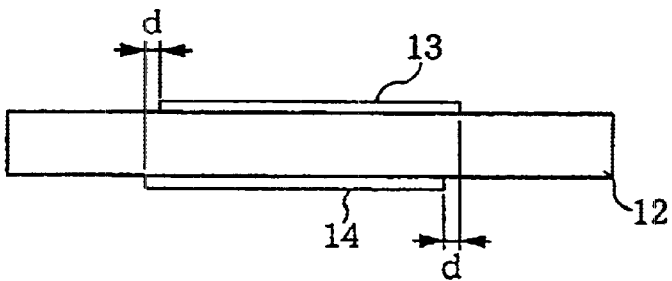

Thereafter, in a process step of FIG. 3(e) those portions of the aluminum films 20 which are not covered with the photoresist layer 21 are etched away with an etchant or the like, leaving the portions of the aluminum films which will ultimately form the electrodes 13 and 14. Finally, the remaining photoresist layers are removed with a remover, completing such a structure as shown in FIG. 3(f). This process step is similarly employed in a batch process as well.

The predetermined amount of displacement of each mask in the direction orthogonal to the X-axis direction in the step of FIG. 3(c) is worked out based on the temperature characteristic of the quartz substrate measured after having evaporated the aluminum film 20 over the entire area of the substrate surface as depicted in FIG. 3(a). That is, the difference between the substrate cutting angle and a target value is calculated based on the temperature characteristic inherent in the quartz substrate obtained in the step of FIG. 3(a), and the thus calculated difference is used to calculate the required amount of displacement of the two electrodes from each other. In the exposure step of FIG. 3(c) the photoresist layers are exposed to light after the two masks having apertures necessary for forming the electrodes displaced apart as predetermined are shifted relative to each other based on the amount of displacement worked out as mentioned above.

Trimming Method

Figure 4:
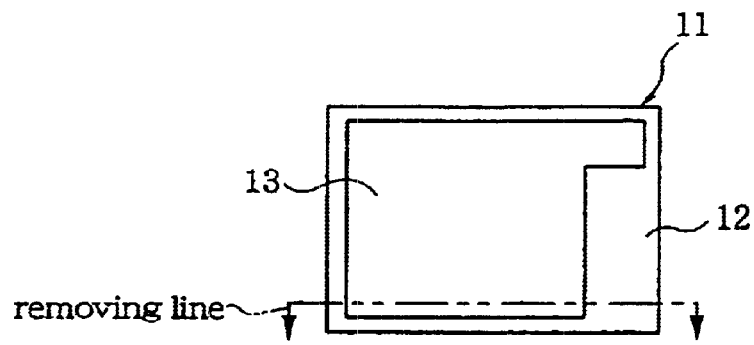
FIG. 4 is a diagram for explaining an electrode removing method by laser trimming.
Figure 5:
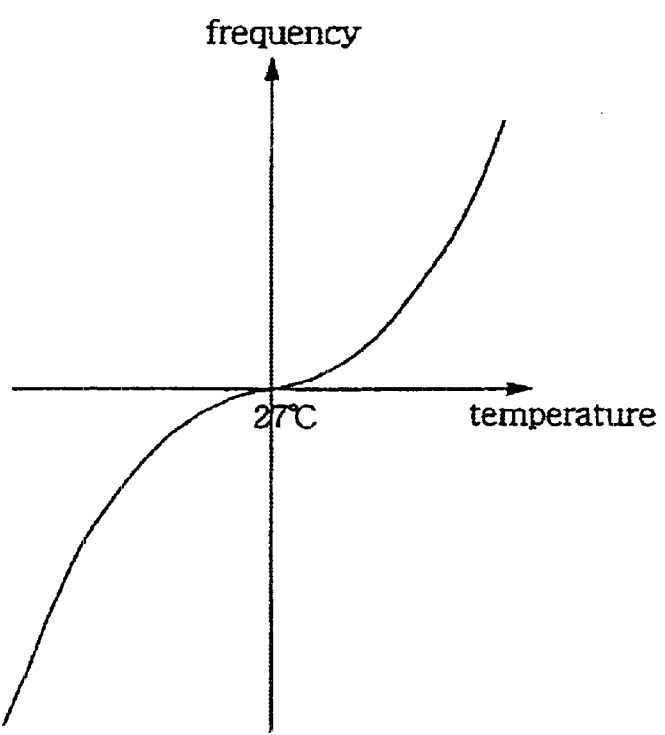
FIG. 5 is a diagram depicting a temperature-frequency characteristic of an AT-cut quartz substrate.

In the case of a quartz resonator produced by a method different from that depicted in FIG. 3, trimming with a laser or the like may become effective in selectively removing one of the two electrodes to displace them apart as described above. For example, in the case of a quartz resonator manufactured by vapor deposition of the electrodes directly on its quartz substrate through masks, the temperature characteristic of the quartz substrate before the formation thereon of the electrodes cannot be measured; therefore, after the temperature characteristic of the quartz substrate after the formation of the electrodes is measured, a marginal portion 13A of at least one of the two electrodes in the X-axis direction is removed by a required amount to correct the temperature characteristic (FIG. 4).

Another Evaporation Method

The quartz resonator manufacturing methods described above are all based on the premise that the temperature-frequency characteristic of the quartz substrate is measured with the electrodes vapor-deposited thereon; however, there is known in the art a method which measures the temperature-frequency characteristic of a quartz substrate. The method is called an air gap method. According to this method, electrode plates are disposed opposite both sides of the quartz substrate with predetermined gaps defined therebetween, an AC current is fed to both of the electrode plates to excite the quartz substrate, by which its temperature-frequency characteristic can be detected without forming electrode films directly on the substrate. Hence, the electrode structure according to the present invention can be obtained by evaporating the electrode films after shifting the positions of. masks based on the characteristic value measured by this method to correct for an error of the substrate cutting angle as desired.

It is also possible to supply a current across the two electrode plates while keeping one of them in contact with one side of the quartz substrate.

Grounds for Distinguishing the Electrode Structure of the First Embodiment From an Error During Manufacture In general, positioning accuracy of the two electrodes which are formed on both sides of the quartz substrate by etching through masks is around ±30 mm mainly due to relative displacements of the two masks from their normal positions, that is, caused by a misalignment between them. There is no possibility of an error greater than ±50 mm being caused even if an error during etching is included.

For the reason given above, according to the present invention, the amount of displacement d of the two electrodes 13 and 14 relative to each other in the direction orthogonal to the X-axis direction is set in the range of 50 $\mu$m<d<0.5 mm. That is, a relative displacement of the electrodes in excess of 50 $\mu$m in the direction orthogonal to the X-axis direction falls within the range of displacement by human error. By intentionally displacing the two electrodes apart within a range of less than 0.5 mm, the frequency deviation resulting from an error in the cutting angle can be held in the permissible limits.

Incidentally, the numerical values mentioned in the above embodiments, such as the oscillation frequency of the quartz resonator used, values of errors in the cutting angle and in the temperature-frequency characteristic, are all intended to be merely illustrative of the embodiments, and the present invention is not limited specifically to them.

Relationship Between the Direction of Displacement of the Electrodes and the Temperature Characteristic Next, a description will be given, with reference to FIG. 6, of the temperature characteristic of a quartz resonator having the electrode structure depicted in FIG. 1 or FIG. 3(f). Let it be assumed that the quartz resonator has such a temperature characteristic indicated by the curve A when the electrodes on both sides of the quartz substrate are not displaced apart. With the electrodes 13 and 14 displaced a distance d apart in such a direction as referred to previously in respect of FIG. 1, the temperature characteristic of the quartz resonator deviates as indicated by the curve C. When the positions of the electrodes 13 and 14 are shifted by d in the direction opposite to that in FIG. 1, the temperature characteristic of the quartz resonator deviates as indicated by the curve B. When the distance d is 0.2 mm, the variation in the cutting angle corresponds to about 2 degrees, and when the distance d is 0.1 mm, the variation corresponds to about 1 degree.

Effects of the First Embodiment

As described above, according to this embodiment, the positions of the electrodes on both sides of the quartz substrate are shifted relative to each other in the direction orthogonal to the X-axis direction, or at least one of those opposed marginal portions of at least one of the electrodes extending in the X-axis direction is displaced or removed in the direction orthogonal thereto or removed. Hence, this embodiment dispenses with the need for raising the ratio of conforming to nonconforming quartz substrates by eliminating variations in their cutting angle, but makes it possible to use nonconforming quartz substrates to offer customers low-cost quartz resonators of oscillation frequencies following various specs, by making easy, simple structural modifications of slightly changing the electrode arrangement or structure, or by making simple improvements to the process of forming electrodes of the conventional quartz resonator through photolithography (adjustments to the positions or areas of apertures of the masks used therefor). Besides, in the manufacture of oscillators for use in consumer-electronics equipment, it is possible to fulfill any particular specs without inserting a temperature compensating circuit in the oscillation circuit, and in the case of industrial equipment, the temperature compensating circuit in the oscillation circuit need not be adjusted.

Conventionally, portable radio makers or like customers, who purchase quartz resonators or oscillators from a quartz manufacturer and incorporate them into industrial portable radios or the like, mount such a bulky part as a packaged TCXO on a board where radio circuits are formed, but nowadays it is preferable to directly incorporate the quartz resonator into a temperature compensated oscillation circuit composed of chips about several millimeters in size formed on the board of the radio or the like. The reason for this is that the area occupied by the temperature compensated oscillation circuit on the board is smaller than in the past.

That is, when the packaged TCXO or the like is mounted on the board, the temperature compensating circuit in the package ensures stabilization of the temperature-frequency characteristic of the quart resonator, and hence it eliminates the need for frequency adjustments after mounting the package on the board; on the other hand, however, the package occupies much space on the board, incurring such disadvantages as bulkiness of the radio and limitations on the degree of flexibility in its layout.

In contrast to the above, when the conventional quartz resonator is incorporated intact into the temperature compensating circuit composed of chips, since it is not guaranteed that the temperature-frequency characteristic of the purchased quartz resonator falls within acceptable limits, it is necessary to measure the temperature-frequency characteristic with the whole board structure held in a constant temperature box after incorporation of the quartz resonator into the temperature compensating circuit and to make adjustments to elements of the chips such as a thermistor and a capacitor based on the measured results; such complicated adjustments inevitably increase the manufacturing processes involved and raise the manufacturing costs accordingly.

In this instance, it would be highly beneficial if a quartz resonator having a temperature-frequency characteristic within certain acceptable limits could be purchased and mounted on the board, because a temperature-compensated frequency could be obtained without involving any adjustments. On this account, it is a tendency that customers wish to purchase quartz resonators with temperature-frequency characteristics held within the acceptable range.

In the past, however, even if customers tried to purchase quartz resonators which met the specs, they suffered not only from an undersupply of such quartz resonators but also from delayed deliveries and high purchase prices because of the low ratio of conforming quartz resonators on the part of the quartz maker.

On the other hand, according to the present invention, frequency deviations of all available quartz resonators in a certain temperature range can be kept within acceptable limits. Hence, the invention enables industrial radio makers or similar customers to fabricate radio circuits without involving such adjustments as in the prior art, simply by adding quartz resonators having their temperature-frequency characteristics held within the acceptable limits to temperature compensated oscillation circuits formed on boards of the radio circuits.

Second Embodiment

It has been described previously with respect to the first embodiment that when the opposed electrodes on both sides of the AT-cut quartz substrate are slightly shifted from each other in the direction orthogonal to the X-axis direction, that is, in the Z'-axis direction, the frequency-temperature characteristic of the resulting quartz resonator becomes equivalent to that of a quartz resonator made from a substrate cut out at a slightly different angle.

That is, in the first embodiment, the electrodes 13 and 14 are formed by means of evaporation or photolithography on the both sides of the quartz substrate 12 substantially centrally thereof as shown in FIGS. 1(a) and (b). In this instance, by slightly shifting the electrodes 13 and 14 relative to each other in the Z'-axis direction while holding them in opposing relation to each other in the X-axis direction, the frequency-temperature characteristic of the quartz resonator is provided corresponding to the amount of relative shift of the opposed electrodes; namely, the quartz resonator behaves as if it were made from a substrate 12 cut out at a slightly different angle.

Figure 6:
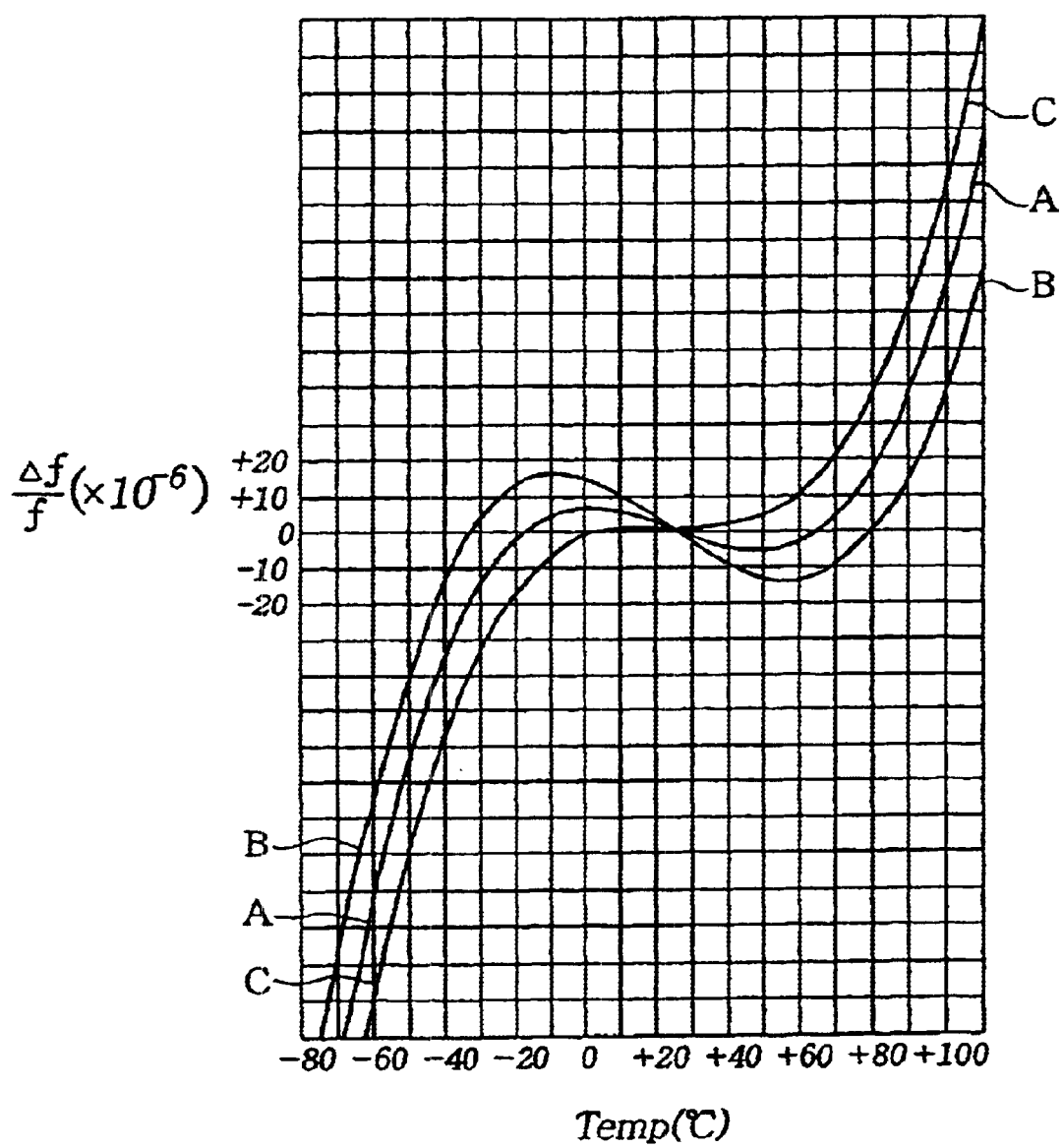
FIG. 6 is a diagram showing temperature-frequency characteristics of three quartz substrates of different cutting angles.

In other words, when the opposed electrodes 13 and 14 are displaced apart on the substrate as depicted in FIGS. 1(a) and (b), the resonator has such a frequency-temperature characteristic as indicated by the curve C in FIG. 6, whereas when the opposed electrodes are not shifted relative to each other, the resonator will have such a frequency-temperature characteristic as indicated by the curve A.

When the opposed electrodes 13 and 14 are shifted relative to each other in the direction opposite to that in FIGS. 1(a) and (b), the resonator will have such a frequency-temperature characteristic as indicated by the curve B in FIG. 6, that is, the resonator will exhibit a characteristic as if it were made from a quartz substrate 12 whose cutting angle is opposite in direction to that in the above.

However, although the opposed electrodes are displaced a desired distance apart using evaporation masks or by photolithography after evaporation of a metallic film all over the quartz substrate as described above, there is a problem in trimming off one of the electrodes in the Z'-axis direction by a laser beam or the like to correct for the frequency-temperature characteristic after the formation of the electrodes. That is, the irradiation of the quartz substrate with the laser beam from a direction perpendicular thereto results in the removal of the electrode on the other side as well since the quartz substrate is transparent. This problem may be solved, for example, by irradiating the quartz substrate with the laser beam or the like at a predetermined incident angle to the quartz substrate, but since the substrate is too thin, it is extremely difficult to set the incidence angle.

Construction of the Second Embodiment

Figure 7A:
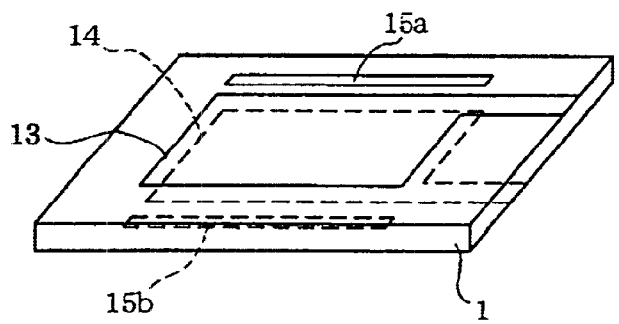
FIG. 7(*a*) is a perspective view of a temperature compensated AT-cut quartz resonator according to the present invention, and (b) is its sectional view.
Figure 7B:
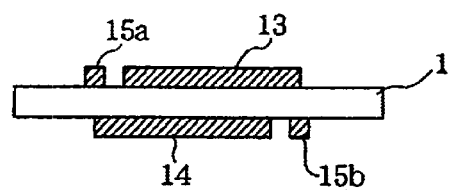

FIGS. 7(a) and (b) illustrate an example of the construction of a temperature characteristic compensated AT-cut quartz resonator according to the second embodiment of the present invention, FIG. 7(a) being its perspective view and FIG. 7(b) a sectional view of the substrate along its center in the Z'-axis direction. The electrodes 13 and 14 are formed on both sides of the quartz substrate 12 substantially centrally thereof by means of vapor deposition or photolithography. In this case, the upper and lower electrodes 13 and 14 are disposed exactly opposite (in vertical alignment) with respect to the X-axis direction but slightly displaced apart from vertical alignment with respect to the Z'-axis direction. Further, thin films 15a and 15b are formed, as balancing loads, adjacent marginal edges of the electrodes 13 and 14 in the direction opposite to that in which the electrodes are displaced from vertical alignment. The films 15a and 15b for balancing use may be formed of the same material as that of the electrodes 13 and 14 and formed simultaneously therewith, but they may also be formed of a different material such as, for example, a nonconductive material.

As is well-known in the art, the quartz crystal is an anisotropic crystal, whose piezoelectricity differs with the direction of its crystallographic axis. As exemplified in FIG. 8, when the upper and lower electrodes 13 and 14 on the quart substrate 12 are shifted relative to each other in the Z'-axis direction, an electric field acts on the opposite marginal portions of the electrodes 13 and 14 aslant with respect to the substrate surface. It is presumed that this phenomenon causes the resonator to exhibit such a frequency-temperature characteristic as if it were made from a quartz substrate cut out at an angle slightly different from that of the quartz substrate 12.

Moreover, when the upper and lower electrodes 13 and 14 on the quartz substrate 12 are displaced apart in the Z'-axis direction as mentioned above, the mass added by the electrodes 13 and 14 provides the same frequency-temperature characteristic as if the cutting angle of the substrate 12 were changed slightly.

But, when the electric field is inclined along the marginal portion of each electrode by the relative displacement of the electrodes 13 and 14 from vertical alignment, the actions on the frequency-temperature characteristic of the quartz resonator by the inclined electric field and by a mass-increasing effect of the displaced-apart electrodes 13 and 14 offset each other. That is, it was clarified by various experiments that the effects on the frequency-temperature characteristic differ between the electric-field effect and the mass-increasing effect offset each other.

Figure 8:
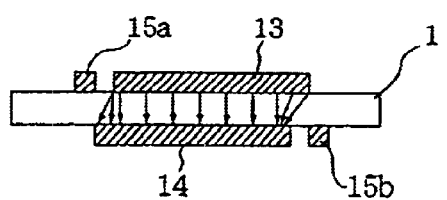
FIG. 8 is a diagram showing the direction of an electric field applied to the temperature compensated AT-cut quartz resonator.

In view of the above, this embodiment is intended to lessen the effect of the mass loads of the upper and lower electrodes 13 and 14 on the temperature characteristic through utilization of the effect that the electric field exerts on the temperature characteristic due to the relative displacement of the electrodes 13 and 14. As depicted in FIG. 8, mass is additionally provided adjacent the electrodes 13 and 14 in the direction opposite to that of their relative displacement from vertical alignment so that electrode mass is balanced to overcome the above problem. The formation of the balancing loads 15a and 15b reduces non uniformity of the mass distribution caused by the relative displacement of the electrodes 13 and 14 in the Z'-axis direction.

Since the balancing loads 15a and 15b are used to produce the mass-increasing effect, they a may be formed of the same material as that of the electrodes 13 and 14, or a nonconductive material may be used. However, they may preferably be formed of a material which can easily be removed little by little by a laser or electron beam or the like, since one of the objects of this embodiment is to remove the mass of the balancing loads 15a and 15b little by little by the laser or electron beam and to slightly turn the frequency-temperature characteristic of the quartz resonator about its inflection point, thereby fulfilling the desired specification.

Figure 9A:
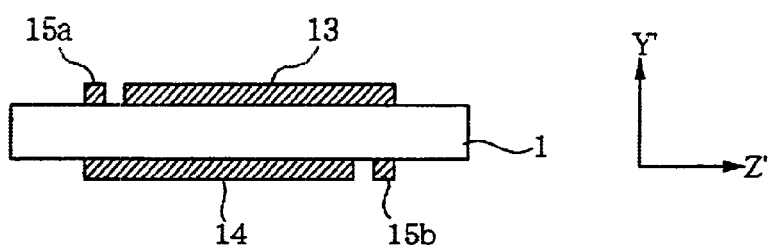
FIG. 9 shows in section for explaining a frequency-temperature characteristic correcting method, in which (a) depicting the structure before correction, (b) a structure with one of balancing loads partly removed, and (c) a structure with the balancing loads both partly removed.
Figure 9B:
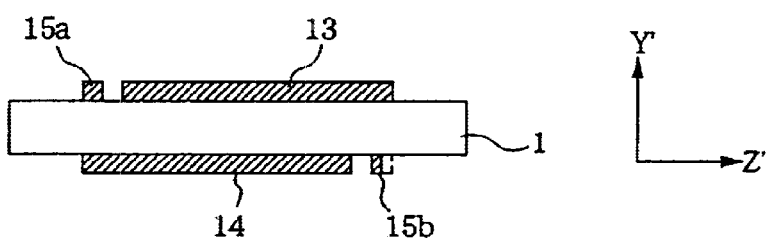
Figure 9C:
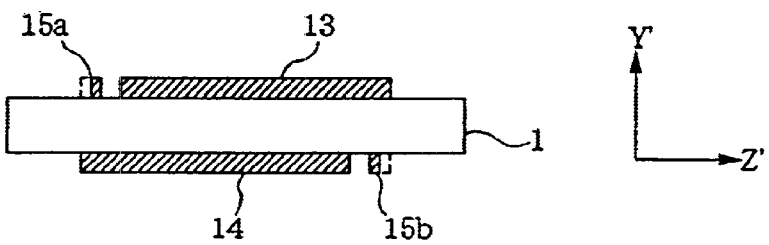

Next, a description will be given of a characteristic correcting method according to the second embodiment, that is, a method of correcting for the frequency-temperature characteristic of the quartz resonator by removing very small amounts of the balancing loads 15a and 15b. As depicted in FIG. 9(a), the electrodes 13 and 14 on the quartz substrate 12 are slightly displaced apart in the Z-axis direction, and the balancing loads 15a and 15b are disposed adjacent the electrodes 13 and 14 in the direction opposite to that of their relative displacement. Assume that the frequency-temperature characteristic of the quartz resonator of this structure is such as indicated by the curve B in FIG. 6. FIG. 9(b) shows the case where only the balancing load 15b has been removed little by little by means of a laser or the like. The frequency-temperature characteristic of the resonator of the structure depicted in FIG. 9(b) changes to such a characteristic as indicated by the curve A in FIG. 6. FIG. 9(c) depicts the case where both balancing loads 15a and 15b have partly been removed. The resonator of this structure exhibits such a frequency-temperature characteristic as indicated by the curve C in FIG. 6. This embodiment features gradual trimming-off of the balancing loads 15a and 15b in the directions of their shorter sides (widthwise thereof) through the use of the laser beam or the like; hence, there is no fear of accidental removal of the electrode on the other side of the resonator.

As is well-known, in the case of using the laser or electron beam to adjust the balancing loads 15a and 15b, it is also possible to adjust the thin films and electrodes in the direction of their thicknesses (in the direction in which to reduce their thicknesses).

Incidentally, FIGS. 9(b) and (c) merely illustrate, by way of example, the frequency-temperature characteristic correcting method; and in practice, quartz resonators mostly meet the specs of the frequency-temperature characteristics by trimming off the loads to the extent intermediate between the amounts removed in the above examples.

By gradually removing one or both of the balancing loads 15a and 15b by means of a laser as described above, a desired frequency-temperature characteristic can be obtained.

It is a matter of course that this correction method is also applicable to the case of making required adjustments to the balancing loads when the two electrodes are not displaced apart as in the case of a modified form of the invention depicted in FIG. 10.

Incidentally, while the above description has been given of the method for correcting the frequency-temperature characteristic of the resonator using the quartz crystal, it is needless to say that this temperature characteristic correcting method is applicable not only to the quartz resonator but also to resonators using other crystals such as $LiNbO_3$, $LiTaO_3$, $La_3Ga_5SiO_{14}$ and similar piezoelectric crystals.

Figure 10A:
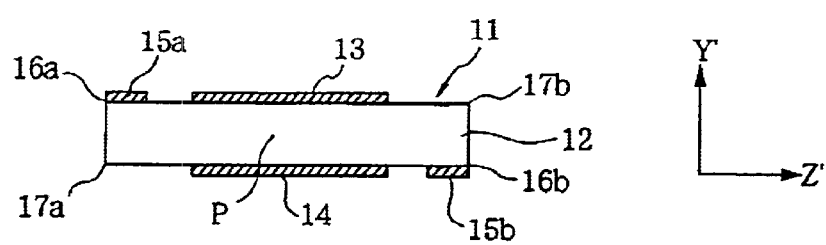
FIG. 10(*a*) is a front view of a modified form of a second embodiment, and (b) is a plan view of another example.

FIG. 10(a) is a diagram depicting the frontal configuration of a quartz resonator according to a modification of the second embodiment of the present invention. This example adjusts the frequency of a quartz resonator of a temperature characteristic outside desired specs by adding thereto masses formed by vapor-depositing metallic films as the balancing loads 15a and 15b at positions symmetrical about the center point P of the frontal configuration.

This modification differs from the examples of FIGS. 8 and 9 in a structure wherein the two electrodes 13 and 14 opposite the quartz substrate 12 are not displaced apart but instead the balancing loads 15a and 15b are disposed along two marginal portions 16a and 16b of the both principal surfaces in parallel to the X-axis direction. As a general rule, the balancing loads 15a and 15b are formed symmetrically about the center point P of the frontal configuration of the substrate 12. When the direction of the measured frequency deviation of the quartz resonator is in the opposite direction, the balancing loads are disposed, of course, on the principal surfaces of the substrate along two marginal edges 17a and 17b on a diagonal different from that joining the marginal portions 16a and 16b.

The balancing loads disposed at positions of point-symmetry may also be made different in mass as required.

It is a matter of course that the characteristic can be corrected by reducing the mass of each balancing load through laser trimming or the like.

Figure 10B:
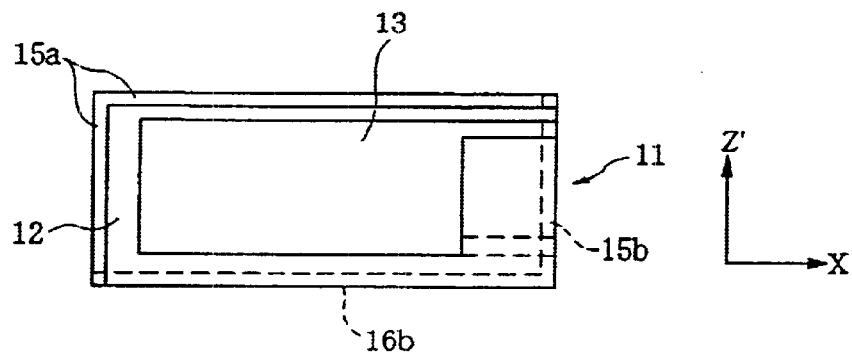

The plane configuration of each balancing load may be a strip-like form extending along the marginal edge of the quartz substrate in the X-axis direction or L-letter shaped as shown in FIG. 10(b).

Briefly stated, this modified example makes frequency adjustments by forming a mass on the principal surface of the quartz substrate along at least one of the opposite marginal edges thereof (the marginal edges parallel to the X axis) when the measured frequency deviates from the desired temperature characteristic curve to one side. When it is necessary to make fine adjustments to the frequency in the opposite direction, a mass is provided on the principal surface of the quartz substrate along the other marginal edge.

Effects of the Second Embodiment

In the embodiments of FIGS. 7 to 9, the electrodes formed on both principal surfaces of the quartz substrate are shifted in the Z'-axis direction and the balancing loads formed at predetermined positions adjacent the electrodes are removed little by little by a laser or electron beam, by which it is possible to turn the frequency-temperature characteristic about the inflection point. This produces the same effect as if to correct the cutting angle toward a predetermined value by trimming off the balancing loads, allowing ease in correcting for the deviation of the quartz substrate cutting angle. Hence, this embodiment brings about the effect of not only raising the yields of quartz substrates but also improvising the yields of quartz resonators since the frequency-temperature characteristic of the quartz resonator in the package can be corrected by means of a laser or the like.

The same goes for a modified form depicted in FIG. 10.

Third Embodiment

The first embodiment proposes an AT-cut quartz resonator in which two electrodes on a quartz substrate are shifted relative to each other in a direction orthogonal to the X-axis direction to bring within required specifications the frequency deviation of the quartz resonator which is caused by variations in the cutting angle of the AT-cut quartz substrate. And the second embodiment proposes the formation of mass-balancing loads on the quartz substrate at positions in the direction to the X-axis direction in which the two electrodes are displaced a required distance apart. The structure of the AT-cut quartz resonator which settles the above mentioned problem is not limited specifically to the first and second embodiments.

That is, a third embodiment of the present invention is characterized by a structure which is obtained by measuring the characteristic of the quartz resonator after the formation of a main electrode on either principal surface of the quartz substrate, then detecting its frequency deviation based on the measured value, and removing the surface layer of the quartz substrate as required at an appropriate portion thereof not covered with the electrode so as to correct the frequency deviation. In other words, according to this embodiment, when the measured temperature characteristic curve of the quartz resonator deviates from a desired temperature characteristic to one side, an adjustment is made to the measured characteristic curve by deleting its linear coefficient to make it approach the desired characteristic curve.

Figure 11A:
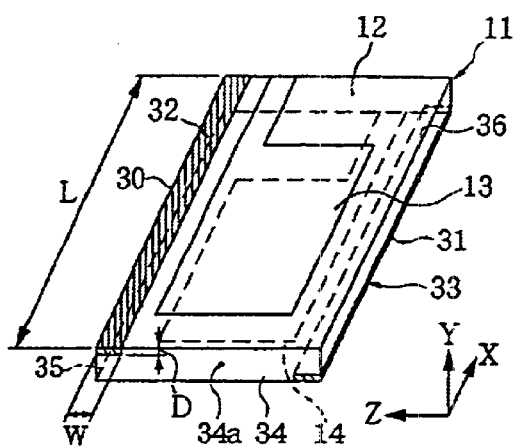
FIGS. 11(*a*), (*b*) and (*c*) are perspective views illustrating constructions of quartz resonators according to a third embodiment of the present invention.

Each of FIGS. 11(a), (b) and (c) shows an example of a surface region of a rectangular quartz resonator 11, in which its marginal edges 30 and 31 are removed in a direction parallel to the X-axis direction to keep the frequency deviation within required specifications. In this embodiment, the substrate surface regions to be removed, that is, the substrate surface regions not covered with electrodes 13 of the quartz resonator which are selectively removed, are the substrate surface regions of required widths extending along the marginal edges 30 and 31 of the two principal surfaces in the X-axis direction as indicated by reference numerals 32 and 33. The deviation-adjusting surface regions 32 and 33 are disposed on a diagonal line-in symmetric relation to a center point 34a of a substrate end face 34. The area (width W, length L) and depth D of each of the adjustment regions 32 and 33 can be freely selected according to the value of the frequency deviation to be corrected for, and the length L need not be chosen to be equal to the entire length of each of the marginal edges 30 and 31. The adjusting regions 32 and 33 may preferably be formed by equally removing the substrate surface regions.

In this embodiment the adjusting regions 32 and 33 are formed along both marginal edges 30 and 31 on one diagonal line, but, when it is found by measurement that the frequency deviation of the quartz resonator is in the opposite direction, adjustment surface regions 37 and 38 (not shown) containing marginal edges 35 and 36 in the diagonal direction opposite to that in FIG. 11(a) are removed. The diagonal on which to form the adjustment regions is dependent on the direction of the frequency deviation detected by the characteristic measurement of the quartz resonator, and the amount of removal and its range are chosen so that the temperature characteristic curve can be obtained. The same holds true with all of the embodiments described below.

Figure 11B:
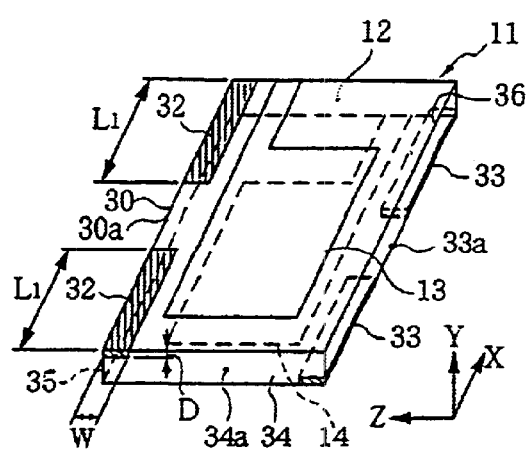

The quartz resonator depicted in FIG. 11(b) has a construction in which the adjustment regions 32 and 33 extending along the two marginal edges 30 and 31 on one diagonal line of the end face 34 of the quartz substrate are each divided into two in the X-axis direction. In this example, the thus divided adjustment regions 32 and 33 are located at the front and rear sides of the substrate 12 in symmetric relation to center points 30a and 31a, respectively; however, they may also be positioned closer to the center points 30a and 31a. The adjustment region may also be split into three or more. The area (width W1, length L1) and depth D1 of each adjustment region can freely be chosen according to the value of the frequency deviation desired to be corrected.

The adjustment regions 32 and 33 may preferably be common in shape and depth.

Figure 11C:
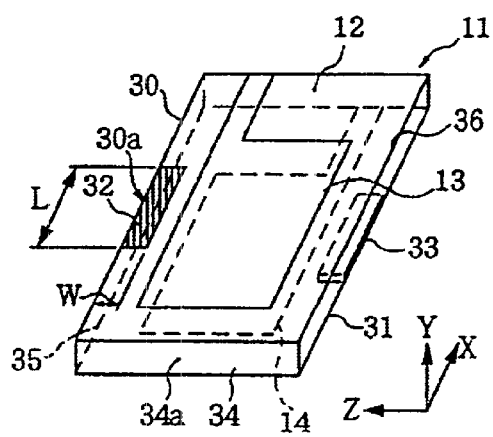

In the quartz resonator 11 of FIG. 11(c), the deviation adjustment regions 32 and 33, which are formed along the marginal edges 30 and 31 in the X-axis direction, are located with their centers in the lengthwise direction held in alignment with the center points 30a and 31a of the marginal edges 30 and 31, respectively. In this case, the opposite ends of both adjustment regions 32 and 33 are equidistant from the center points 30a and 31a, respectively. The area (width W1, length L1) and depth D1 of each region can freely be chosen according to the value of the frequency deviation desired to be corrected. The adjustment regions 32 and 33 may preferably be common in shape and depth.

The deviation adjustment regions of the quartz resonator can be formed by trimming with a laser or by etching with photolithography.

In the frequency adjustment by selectively removing the quartz surface region of the quartz resonator 11 obtained by forming the electrodes 13 on both sides of the quartz substrate, the characteristic of the quartz resonator is measured and, based on the direction and value of the frequency deviation detected by the measurement, the temperature characteristic is adjusted in the direction in which to approach the desired characteristic curve. In this case, the temperature characteristic curve can be adjusted to have a desired curve by forming the adjustment regions along a pair of diagonally opposite marginal edges 30 and 31 or 35 and 36.

It is also possible to make a readjustment by forming the adjustment regions (32, 33) along one pair of marginal edges, for example, (30, 31) to deviate the characteristic in one direction and then forming the adjustment regions (37, 38) along the other pair of marginal edges (35, 36). In this instance, too, as described above, the surface regions of the quartz substrate are removed so that the adjustment regions of each pair are the same in shape and depth.

Figure 12A:
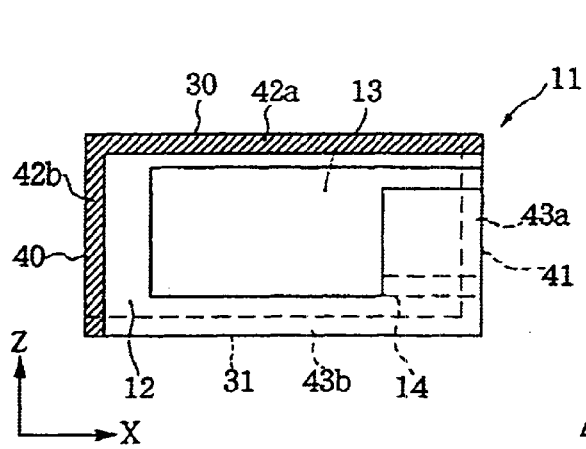
FIGS. 12(a) and (b) are a plan and a perspective view illustrating the construction of a modified form of the third embodiment of the present invention.
Figure 12B:
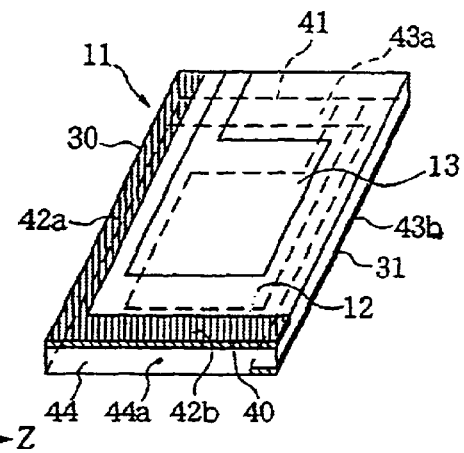

FIGS. 12(a) and (b) are plan and perspective views illustrating the construction of a modified form of the quartz resonator according to the third embodiment of the present invention. The AT-cut quartz resonator of this embodiment has an L-shaped adjustment region 42 (42a, 42b) extending along a marginal edge 30 in the X-axis direction and a marginal edge 40 in the Z-axis direction orthogonal to the marginal edge 30 and a similar L-shaped adjustment region 43 (43a, 43b). The areas and depths of the respective sides 42a, 42b and 43a, 43b of the L-shaped adjustment regions can be chosen at will according to the value of the frequency deviation desired to be corrected. It is desirable that the respective adjustment region be common in the amount of removal of the substrate surface region. The regions 42 and 43 depicted in FIG. 12 are formed to correct for one-sided frequency deviation, and when the direction of frequency deviation is opposite to the above, the L-shaped adjustment regions are formed along other marginal edges in symmetric relation to a center point 44a of frontal configuration of the resonator.

The region 42a extending in the X-axis direction and the region 42b extending in the Z-axis need not always be contiguous to each other, and they may also be separated at the corner of the substrate.

It is also possible to make a readjustment by forming one of the adjustment regions (42, 43) to deviate the characteristic in one direction and then forming the other adjustment region along the other pair of marginal edges. In this instance, too, as described above, the surface regions of the quartz substrate are removed so that the adjustment regions of each pair are the same in shape and depth.

While in the first to third embodiments the present invention has been described as being applied to the frequency adjustment of a rectangular quartz resonator by selective removal of the substrate surface regions, the invention is applicable to quartz resonators of other shapes as well.

Figure 13A:
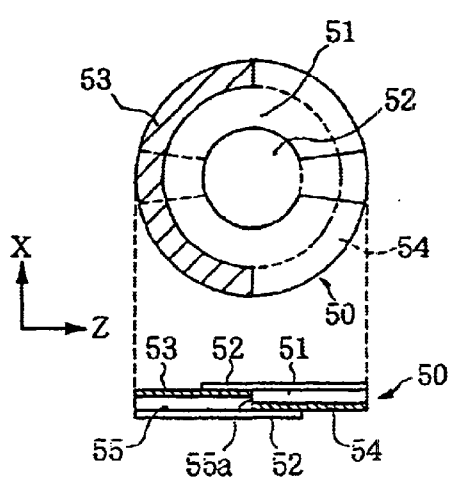
FIGS. 13(a) and (b) are plan views depicting constructions of other modifications of the third embodiment of the present invention.

FIGS. 13(a) and (b) depict examples in which the third embodiment of the frequency adjustment method of present invention is applied to quartz resonators each having electrodes formed on two principal surfaces of a circular quartz substrate. The quartz resonator 50 of FIG. 13(a) has electrodes 52 formed on both principal surfaces of a circular quartz substrate 51, a semicircular deviation adjustment region 53 of a fixed width formed on one side of the quartz substrate 51 along a semicircular periphery (a circumferential portion is about the marginal edge along the X axis) and a semicircular adjustment region 54 of a fixed width on the other side along a semicircular periphery. The adjustment regions 53 and 54 are located simmetrically with respect to a center point 55a of the frontal configuration 55 of quartz substrate 51. The circumferential lengths, widths and depths of to the adjustment regions can freely be chosen according to the value of the frequency deviation desired to be corrected. Accordingly, for example, the circumferential length of each region need not be ½ of the entire circumference of the quartz substrate but may be shorter. Furthermore, each adjustment region may also be spit into two or more.

Figure 13B:
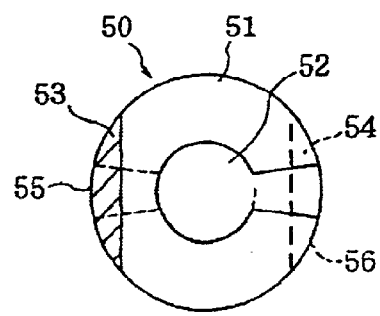

FIG. 13(b) depicts a modified form of the quartz resonator shown in FIG. 13(a). The quartz resonator 50 of this example has a semicylindrically-sectioned first adjustment region 54 formed on one side of the substrate 51 along a marginal edge in the X-axis direction, and a second adjustment region 54 of the same shape as the first region 53 on the other side and formed on the reverse side along a marginal edge 56. The formation of such adjustment regions according this embodiment provides the same frequency adjustment function as is obtainable with the embodiments described above.

FIGS. 14(a), (b) and (c) depict sectional configurations of the adjustment areas of the embodiments described above, FIG. 14(a) showing the case of selectively removing the substrate surface regions to form stepped portions of uniform thicknesses along the marginal edges of the substrate as in the FIG. 11 example, FIG. 14(b) showing the case of selectively removing the substrate surface regions to provide bevels (tapered portions) along the marginal edges of the substrate, and FIG. 14(c) showing the case of forming adjustment regions each composed of stepped and bevelled portions.

FIG. 14(a) depicts an example in which flat (step-shaped) regions 32, 42, 53, 33, 43, 54 are formed on the principal surfaces of the rectangular or circular quartz resonator 11 or 50 along the marginal edges lying on one diagonal line passing through the center point P of the front of the resonator, and the regions are common in depth and width.

FIG. 14(b) depicts an example in which the same quartz resonator 11 or 50 as in FIG. 14(a) are bevelled similarly along the marginal edges thereof for frequency adjustment. The bevelled adjustment regions 60 and 61, which are symmetrical with respect to the center point P, are designed to have the same shape (common in bevel angle, width and depth).

FIG. 14(c) depicts an example in which adjustment regions 65 and 66, each composed of stepped and bevelled portions, are formed along the same marginal edges of the quartz resonator 11 or 50 as in FIGS. 14(a) and (b).

The sectional configurations of the adjustment regions described above are all merely illustrative and do not limit the invention specifically thereto. In short, when the temperature-frequency characteristic of the quartz resonator having electrodes formed on both sides of a quartz-substrate is measured, if it is found that the characteristic of the quartz resonator has a deviation, adjustment regions of the same shape are formed in point-symmetrical relation to each other along a pair of diagonally opposite marginal edges of the substrate extending in the X-axis direction (the Z-axis direction being included in the case of the L-shaped region), thereby correcting the temperature-frequency characteristic curve of the quartz resonator as desired. This is the point of this embodiment. The sectional and planar configurations of the illustrated examples should not be construed as limiting the invention specifically thereto.

The bevelled adjustment regions can be formed by a grinding method using a barrel grinder. That is, after the surface areas of the quartz resonator desired not to be removed are covered with paraffin, the resonator is put in a barrel containing an abrasive or polishing sand, and by revolving the barrel to remove only those surface portions not covered with paraffin. After the grinding, the paraffin is removed.

The step-shaped adjustment regions shown in FIG. 14(a) can effectively be formed by laser trimming or photolithography. In the case of forming the adjustment regions each composed of the stepped and bevelled portions, the stepped portions are formed by laser trimming or photolithography, the surface portions desired not to be removed (including the stepped portions) are covered with paraffin and subjected to grinding by the barrel grinder to form the bevelled portions.

Effects of the Invention

As described above, the first embodiment of the present invention dispenses with the need for raising the ratio of conforming to nonconforming quartz substrates by eliminating variations in their cutting angle, but makes it possible to use nonconforming quartz substrates to offer customers low-cost quartz resonators of oscillation frequencies following various specs, by making easy, simple structural modifications of slightly changing the electrode arrangement or structure, or by making simple improvements to the process of forming electrodes of the conventional quartz resonator through photolithography. In the manufacture of oscillators for use in consumer-electronics equipment, it is possible to fulfill any particular specs without inserting a temperature compensating circuit in the oscillation circuit, and this improves the productivity of various communications equipment and various electronics equipment and reduces their manufacturing costs. In the case of the oscillation circuit for industrial equipment, its adjustment can be dispensed by incorporating an unpackaged quartz resonator into an onboard temperature compensated oscillation circuit.

According to the second embodiment, in the case where the cutting angle of the quartz substrate deviates from a predetermined value due to the accuracy of the cutter used, or an error when setting a quartz block on the cutter or during a grinding operation, evaporation or photolithography is used to shift the vertically opposed electrodes relative to each other in the Z-axis direction on the quartz substrate and to form thereon the balancing loads, and the balancing loads are removed little by little by a laser or electron beam, by which it is possible to turn the frequency-temperature characteristic about the inflection point. This produces the same effect as if to correct the cutting angle toward a predetermined value by trimming off the balancing loads, allowing ease in correcting for the deviation of the quartz substrate cutting angle. Hence, this embodiment brings about the effect of not only raising the yields of quartz substrates but also improvising the yields of quartz resonators since the frequency-temperature characteristic of the quartz resonator in the package can be corrected by means of a laser or the like.

According to the third embodiment, in the case where the frequency deviation is caused by a deviation of the cutting angle of the quartz substrate from a predetermined value while it is cut out of a quartz block or ground, the frequency-temperature characteristic curve of the quartz resonator is turned about the inflection point by selectively removing substrate surface portions after the formation of the quartz resonator. This produces the same effect as if to correct the quartz cutting angle toward a predetermined value by the selective removal of the substrate surface regions, allowing ease in correcting the deviation of the quartz substrate cutting angle. Hence, this embodiment brings about the effect of not only raising the yields of quartz substrates but also improvising the yields of quartz resonators since the frequency-temperature characteristic of the quartz resonator housed in the package can be corrected by means of a laser or the like.

What is claimed is:

1. A method for producing an AT-cut quartz resonator comprising the steps of:

forming metallic films on entire surfaces of two principal surfaces of an AT-cut quartz substrate;

measuring a temperature-frequency characteristic of said quartz substrate on which said metallic films are formed;

calculating an error in a cutting angle of said AT-cut quartz substrate based upon a result of said measuring;

coating positive photoresists on entire surfaces of said metallic films of said AT-cut quartz substrate;

setting apertures of masks, based upon said obtained error in said cutting angle, so that said apertures are slightly displaced apart in opposite directions along the Z-axis of quartz crystal pursuant to a calculated value that is obtained by calculating an error in a cutting angle of said AT-cut quartz substrate;

exposing said positive photoresists through said masks;

removing exposed portions of said positive photoresists;

performing an etching treatment on said AT-cut quartz substrate so as to remove said metallic films except for unexposed positive photoresists; and removing said unexposed positive photoresists.

2. A method for producing an AT-cut quartz resonator comprising the steps of:

providing electrodes so as to respectively face upper and lower surfaces of an AT-cut quartz substrate with a predetermined gap in between;

measuring a temperature-frequency characteristic of said AT-cut quartz substrate by way of allowing an AC current to flow in said electrodes;

calculating an error in a cutting angle of said AT-cut quartz substrate based upon a result of said measuring step;

coating positive photoresists on entire surfaces of metallic films of said AT-cut quartz substrate;

setting apertures of masks, based upon said obtained error in said cutting angle, so that said apertures are displaced a predetermined distance in a direction orthogonal to an X-axis direction, said pets corresponding to a shape of electrodes;

exposing said positive photoresists through said masks;

removing exposed portions of said positive photoresists;

performing an etching treatment on said AT-cut quartz substrate so as to remove said metallic films except for unexposed positive photoresists; and removing said unexposed positive photoresists.

3. A method for producing an AT-cut quartz resonator comprising the steps of:

forming metallic films on entire surfaces of two principal surfaces of an AT-cut quartz substrate;

measuring a temperature-frequency characteristic of said quartz substrate on which said metallic films are formed;

calculating an error in a cutting angle of said AT-cut quartz substrate based upon a result of said measuring;

coating positive photoresists on entire surfaces of said metallic films of said AT-cut quartz substrate;

preparing masks, each of which having an aperture corresponding to a shape of an electrode and an aperture corresponding to a shape of a balancing load, said balancing load extending on a side along an X-axis of said electrode and being away from said electrode in a direction orthogonal to said X-axis;

setting said masks so that said apertures thereof corresponding to said electrode are displaced in a direction orthogonal to an X-axis direction based upon said calculated error in said cutting angle;

exposing said positive photoresists through said masks;

removing exposed portions of said positive photoresists;

performing an etching treatment on said AT-cut quartz substrate so as to remove said metallic films except for unexposed positive photoresists;

removing said unexposed positive photoresists; and measuring a temperature-frequency characteristic of said quartz substrate in this state and removing said balancing load so as to obtain a desired temperature-frequency characteristic.

4. A method for producing an AT-cut quartz resonator comprising the steps of:

providing electrodes so as to respectively face upper and lower surfaces of an AT-cut quartz substrate with a predetermined gap in between;

measuring a temperature-frequency characteristic of said AT-cut quartz substrate by way of allowing an AC current to flow in said electrodes;

calculating an error in a cutting angle of said AT-cut quartz substrate based upon a result of said measuring step;

coating positive photoresists on entire surfaces of metallic films of said AT-cut quartz substrate;

preparing masks, each of which having an aperture corresponding to a shape of an electrode and an aperture corresponding to a shape of a balancing load, said balancing load extending on a side along an X-axis of said electrode and being away from said electrode in a direction orthogonal to said X-axis;

setting said masks so that said apertures thereof corresponding to said electrode are displaced in a direction orthogonal to an X-axis direction based upon said calculated error in said cutting angle;

exposing said positive photoresist through said masks;

removing exposed portions of said positive photoresists;

performing an etching treatment on said AT-cut quartz substrate so as to remove said metallic films except for unexposed positive photoresists;

removing said unexposed positive photoresists; and measuring a temperature-frequency characteristic of said quartz substrate in this state and removing said balancing load so as to obtain a desired temperature-frequency characteristic.

5. A method for producing an AT-cut quartz resonator according to claim 1, 2, 3 or 4, wherein when a first-order coefficient of a cubic curve of an AT-cut quartz substrate that is derived from an error in said calculated cutting angle is smaller than a first-order coefficient of a cubic curve of a temperature-frequency characteristic of said desired cutting angle, said masks are displaced in a direction orthogonal to an X-axis direction so that an electrode provided on an upper side of said AT-cut quartz substrate, when said AT-cut quartz substrate is viewed from an X-axis direction, is shifted toward a right with respect to an electrode provided on a lower side of said AT-cut quartz substrate.

6. A method for producing an AT-cut quartz resonator according to claim 1, 2, 3 or 4, wherein when a first-order coefficient of a cubic curve of an AT-cut quartz substrate that is derived from an error in said calculated cutting angle is larger than a first-order coefficient of a cubic curve of a temperature-frequency characteristic of said desired cutting angle, said masks are displaced in a direction orthogonal to an X-axis direction so that an electrode provided on an upper side of said AT-cut quartz substrate, when said AT-cut quartz substrate is viewed from an X-axis direction, is shifted toward a left with respect to an electrode provided on a lower side of said AT-cut quartz substrate.

7. A method for producing an AT-cut quartz resonator comprising the steps of:

forming excitation electrodes that face two principal surfaces of an AT-cut quartz substrate;

measuring a temperature-frequency characteristic of said AT-cut quartz substrate on which said excitation electrodes are formed;

calculating an error in a cutting angle of said AT-cut quartz substrate based upon a result of said measuring step;

removing at least a part of an end portion of said AT-cut quartz substrate based upon said calculated error in said cutting angle, said part of said end portion being at a point-symmetrical position with respect to a center point of a surface which is viewed from an X-direction of said AT-cut quartz substrate and said part of said end portion being parallel to said excitation electrode and extending in an X-axis direction.

8. A method for producing an AT-cut quartz resonator according to claim 7, wherein removing of said part of said AT-cut quartz substrate is made for an amount equal in width in a Z-axis direction of said AT-cut quartz substrate.

9. A method for producing an AT-cut quartz resonator according to claim 7, wherein removing of said part of said AT-cut quartz substrate is made for an amount equal in width in a Z-axis direction of and for an amount equal in depth in a Y-axis direction of said AT-cut quartz substrate.

10. A method for producing an AT-cut quartz resonator according to claim 7, 8 or 9, wherein removing of said part of said AT-cut quartz substrate is made for an equal amount at point-symmetrical locations.

11. A method for producing an AT-cut quartz resonator comprising the steps of:

forming metallic films on entire surfaces of two principal surfaces of an AT-cut quartz substrate;

measuring a temperature-frequency characteristic of said quartz substrate on which said metallic films are formed;

calculating an error in a cutting angle of said AT-cut quartz substrate based upon a result of said measuring, coating negative photoresists on entire surfaces of said metallic films of said AT-cut quartz substrate;

setting apertures of masks, based upon said obtained error in said cutting angle, so that said apertures are displaced a predetermined distance in a direction orthogonal to an X-axis direction, said apertures corresponding to a shape of electrodes;

exposing said negative photoresists through said mask;

removing unexposed portions of said negative photoresists;

performing an etching treatment on said AT-cut quartz substrate so as to remove said metallic films except for said exposed negative photoresists; and removing said exposed negative photoresists.

12. A method for producing an AT-cut quartz resonator comprising the steps of:

providing electrodes so as to respectively face upper and lower surfaces of an AT-cut quartz substrate with a predetermined gap in between;

measuring a temperature-frequency characteristic of said AT-cut quartz substrate by way of allowing an AC current to flow in said electrodes;

calculating an error in a cutting angle of said AT-cut quartz substrate based upon a result of said measuring step;

coating negative photoresists on entire surfaces of metallic film of said AT-cut quartz substrate;

setting apertures of masks, based upon said obtained error in said cutting angle, so that said apertures are displaced a predetermined distance in a direction orthogonal to an X-axis direction, said apertures corresponding to a shape of electrodes;

exposing said negative photoresists through said mask;

removing unexposed portions of said negative photoresists;

performing an etching treatment on said AT-cut quartz substrate so as to remove said metallic films except for said exposed negative photoresists; and removing said exposed negative photoresists.

13. A method for producing an AT-cut quartz resonator comprising the steps of:

forming metallic films on entire surfaces of two principal surfaces of an AT-cut quartz substrate;

measuring a temperature-frequency characteristic of said quartz substrate on which said metallic films are formed;

calculating an error in a cutting angle of said AT-cut quartz substrate based upon a result of said measuring;

coating negative photoresists on entire surfaces of said metallic films of said AT-cut quartz substrate;

preparing masks, each of which having an aperture corresponding to a shape of an electrode and an aperture corresponding to a shape of a balancing load, said balancing load extending on a side along an X-axis of said electrode and being away from said electrode in a direction orthogonal to said X-axis;

setting said masks so that said apertures thereof corresponding to said electrode arm displaced in a direction orthogonal to an X-axis direction based upon said calculated error in said cutting angle;

exposing said negative photoresist through said masks;

removing unexposed portions of said negative photoresists;

performing an etching treatment on said AT-cut quartz substrate so as to remove said metallic films except for said unexposed negative photoresists;

removing said exposed negative photoresists; and measuring a temperature-frequency characteristic of said quartz substrate in this state and removing said balancing load so as to obtain a desired temperature-frequency characteristic.

14. A method for producing an AT-cut quartz resonator comprising the steps of:

providing electrodes so as to respectively face upper and lower surfaces of an AT-cut quartz substrate with a predetermined gap in between;

measuring a temperature-frequency characteristic of said AT-cut quartz substrate by way of allowing an AC current to flow in said electrodes;

calculating an error in a cutting angle of said AT-cut quartz substrate based upon a result of said measuring step;

coating negative photoresists on entire surfaces of metallic films of said AT-cut quartz substrate;

preparing masks, each of which having an aperture corresponding to a shape of an electrode and an aperture corresponding to a shape of a balancing load, said balancing load extending on a side along an X-axis of said electrode and being away from said electrode in a direction orthogonal to said X-axis;

setting said masks so that said apertures thereof corresponding to said electrode are displaced in a direction orthogonal to an X-axis direction based upon said calculated error in said cutting angle;

exposing said negative photoresists through said masks;

removing unexposed portions of said negative photoresists;

performing an etching treatment on said AT-cut quartz substrate so as to remove said metallic films except for said exposed negative photoresists;

removing said exposed negative photoresists; and measuring a temperature-frequency characteristic of said quartz substrate in this state and removing said balancing load so as to obtain a desired temperature-frequency characteristic.

15. A method for producing an AT-cut quartz resonator according to claim 11, 12, 13 or 14, wherein when a first-order coefficient of a cubic curve of an AT-cut quartz substrate that is derived from an error in said calculated cutting angle is smaller than a first-order coefficient of a cubic curve of a temperature-frequency characteristic of said desired cutting angle, said masks are displaced in a direction orthogonal to an X-axis direction so that an electrode provided on an upper side of said AT-cut quartz substrate, when said AT-cut quartz substrate is viewed from an X-axis direction, is shifted toward a right with respect to an electrode provided on a lower side of said AT-cut quartz substrate.

16. A method for producing an AT-cut quartz resonator according to claim 11, 12, 13 or 14, wherein when a first-order coefficient of a cubic curve of an AT-cut quartz substrate that is derived from an error in said calculated cutting angle is larger than a first-order coefficient of a cubic curve of a temperature-frequency characteristic of said desired cutting angle, said masks arm displaced in a direction orthogonal to an X-axis direction so that an electrode provided on an upper side of said AT-cut quartz substrate, when said AT-cut quartz substrate is viewed from an X-axis direction, is shifted toward a left with respect to an electrode provided on a lower side of said AT-cut quartz substrate.

* * * * *